United States Patent
Endo et al.

(10) Patent No.: US 7,714,915 B2
(45) Date of Patent: May 11, 2010

(54) SOLID-STATE IMAGE DEVICE HAVING MULTIPLE PN JUNCTIONS IN A DEPTH DIRECTION, EACH OF WHICH PROVIDES AND OUTPUT SIGNAL

(75) Inventors: Hiroki Endo, Kanagawa (JP); Hideshi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 864 days.

(21) Appl. No.: 11/298,063

(22) Filed: Dec. 9, 2005

(65) Prior Publication Data

US 2006/0181623 A1   Aug. 17, 2006

(30) Foreign Application Priority Data

Dec. 9, 2004   (JP) .............................. 2004-356204

(51) Int. Cl.
| | |
|---|---|
| H04N 9/083 | (2006.01) |
| H04N 5/335 | (2006.01) |
| H04N 3/14 | (2006.01) |
| H01L 31/062 | (2006.01) |
| H01L 27/00 | (2006.01) |

(52) U.S. Cl. ...................... 348/272; 348/315; 348/294; 257/291; 257/292; 250/208.1

(58) Field of Classification Search ................. 348/277, 348/272–273, 289, 316, 317
See application file for complete search history.

(56) References Cited

U.S. PATENT DOCUMENTS

| 4,670,777 | A  | * | 6/1987 | Ishikawa et al. ............ 348/279 |
|---|---|---|---|---|
| 5,965,875 | A  | * | 10/1999 | Merrill ...................... 250/226 |
| 6,236,434 | B1 | * | 5/2001 | Yamada ..................... 348/315 |
| 7,218,347 | B2 | * | 5/2007 | Shinohara .................. 348/272 |
| 2003/0124763 | A1 | * | 7/2003 | Fan et al. ...................... 438/70 |
| 2004/0179120 | A1 | * | 9/2004 | Shizukuishi ................ 348/272 |
| 2005/0030398 | A1 | * | 2/2005 | Summa ...................... 348/272 |
| 2005/0212940 | A1 | * | 9/2005 | Kobayashi .................. 348/316 |

\* cited by examiner

*Primary Examiner*—Nhan Tran
*Assistant Examiner*—Mekonnen Dagnew
(74) *Attorney, Agent, or Firm*—Robert J. Depke; Rockey, Depke & Lyons, LLC

(57) ABSTRACT

A solid-state image device is provided which has a semiconductor substrate, pixels A each containing a photoelectric conversion portion in which at least two PN junction parts are provide in a depth direction of the semiconductor substrate, pixels B each containing a photoelectric conversion portion in which at least one PN junction part is provided, first color filters provided above the pixels A, second color filters provided above the pixels B; and a detection mechanism for detecting a first color signal and a second color signal from the two PN junction parts of each of the pixels A and a third color signal from the PN junction part of each of the pixels B. According to the above solid-state image device, light can be more efficiently used than a color filter separation method, and superior color reproducibility to that of a three-well structure can be realized.

6 Claims, 8 Drawing Sheets

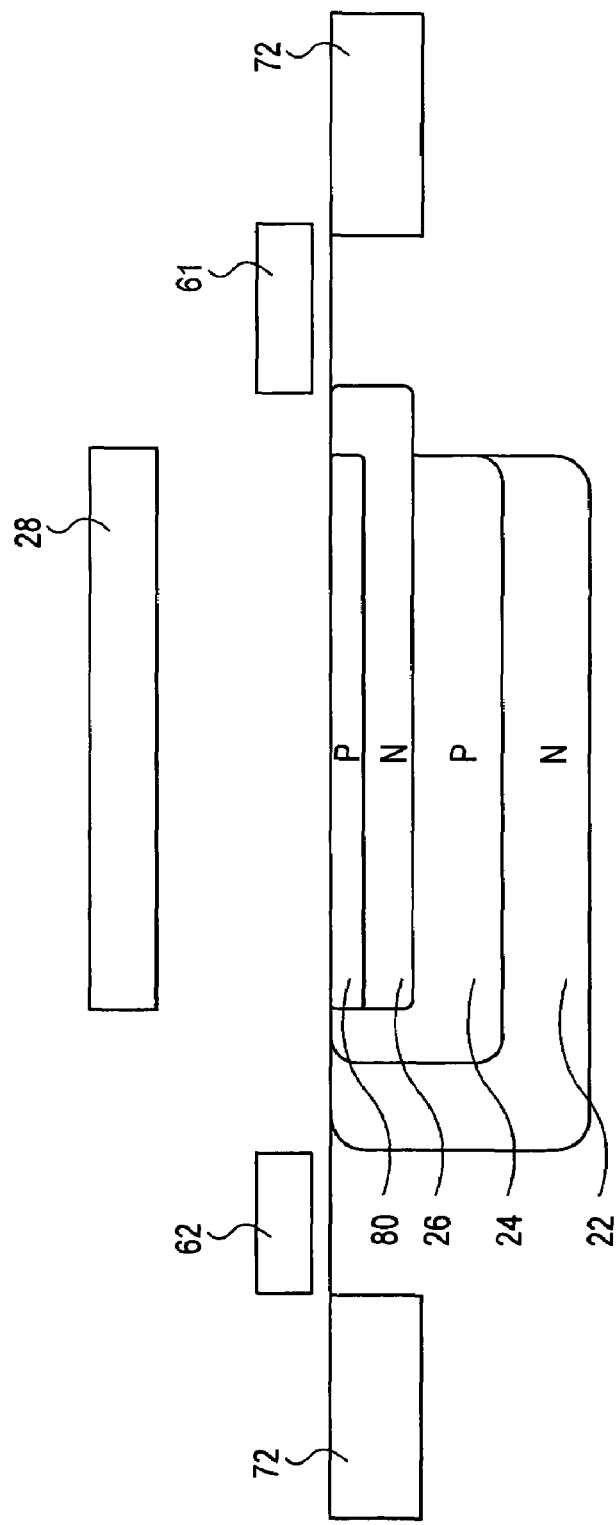

SOLID-STATE IMAGE DEVICE HAVING MULTIPLE PN JUNCTIONS IN A DEPTH DIRECTION, EACH OF WHICH PROVIDES AND OUTPUT SIGNAL

CROSS REFERENCES TO RELATED APPLICATIONS

The present invention contains subject matter related to Japanese Patent Application JP 2004-356204 filed in the Japanese Patent Office on Dec. 9, 2004, the entire contents of which are incorporated herein by reference.

BACKGROUND OF THE INVENTION

1. Field of the Invention

The present invention relates to a solid-state image device detecting different color component signals by color filters disposed on a plurality of pixels.

2. Description of the Related Art

Heretofore, in a solid-state image device used in a single-plate camera, a technique of performing spatial color separation has been generally used in which color filters having three RGB colors are disposed above individual pixels of the solid-state image device. According to this method, by optionally adjusting the spectral characteristics of the color filters, superior color reproducibility can be achieved; however, absorption by the cooler filters, there has been a problem in that light incident on the solid-state image device may not be efficiently used in some cases.

In addition, since spatial color separation is performed, the pixels of the solid-state image device may not be efficiently used. For example, when the number of the G pixels is small, the resolution of brightness signal may be disadvantageously decreased, and when the number of the R and/or B pixels is small, a problem such as decrease in resolution of color signal or generation of color pseudo signal may arise in some cases.

As a method for solving the problems as described above, a solid-state image device using the difference in absorption of light wavelengths in a bulk of silicon has been proposed (see PCT Japanese Translation Patent Publication No. 2002-513145). According to the method described above, three well regions are formed in a substrate along the depth direction thereof in conformity with the difference in absorption of RGB colors so as to collect photons of the RGB light in the respective well regions, and potential difference therebetween is measured (hereinafter referred to as "three-well structure").

The three-well structure as described above has the following advantages as compared to the method performing spatial color separation using color filters.

(1) Loss in light due to absorption by a color filter is not generated, and hence the utilization rate of light is improved.

(2) Since a G signal functioning as a primary component of the brightness signal can be obtained from each pixel, an image having superior resolution can be obtained.

(3) Since sampling positions of respective RGB colors do not coincide with each other, a pseudo signal is unlikely to be generated.

SUMMARY OF THE INVENTION

However, the spectral characteristics of the RGB signals obtained by the three-well structure as described above have a considerably large width of light intensity distribution, and hence very insufficient color separation can only be performed.

As a method for solving the above problem, a conversion matrix from RGB to R'G'B' is effectively used; however, even in this case, compared to the case in which a color filter is used, it has been difficult to obtain spectral characteristics which can realize superior color reproducibility. In addition, even when the conversion matrix from RGB to R'G'B' is used, when RGB is very different from preferable RGB, a conversion matrix coefficient is increased, and as a result, the S/N ratio of an output image is disadvantageously degraded.

Accordingly, it is desirable to have a solid-state image device having a color separation method that efficiently utilizes light as compared to the color filter separation method and that realizes superior color reproducibility as compared to that of the three-well structure.

In order to realize the solid-state image device described above, a solid-state image device according to an embodiment of the present invention includes a semiconductor substrate; pixels A each containing a photoelectric conversion portion in which at least two PN junction parts are provide in a depth direction of the semiconductor substrate; pixels B each containing a photoelectric conversion portion in which at least one PN junction part is provided; first color filters provided above the pixels A; second color filters provided above the pixels B; and detection means for detecting a first color signal and a second color signal from the two PN junction parts of each of the pixels A and a third color signal from the PN junction part of each of the pixels B.

BRIEF DESCRIPTION OF THE DRAWINGS

FIG. 5 is a plan view showing a third specific pixel arrangement used in an example of the present invention;

FIG. 6 is a plan view showing a fourth specific pixel arrangement used in an example of the present invention;

FIG. 10 is a cross-sectional view of a structural example in which charges from a pixel A are read, according to an example of the present invention.

DESCRIPTION OF THE PREFERRED EMBODIMENTS

According to the embodiment of the present invention, there is provided a color separation method simultaneously realizing high light utilization rate and superior color reproducibility by using both the color filter separation method and the difference in absorption of the individual colors in a silicon bulk.

For example, in a solid-state image device having a plurality of pixels A and a plurality of pixels B, a magenta filter is disposed above each pixel A, a green filter is disposed above each pixel B, two PN junction parts are provided at a photoelectric conversion portion of the pixel A in a depth direction of a substrate, a blue signal from one of the PN junction parts of the pixel A at the front surface side of the substrate is detected by a detection mechanism, and a red signal from the other PN junction part at the rear side of the substrate is also detected by the detection mechanism. In addition, a green signal from a PN junction part of the pixel B is detected by the detection mechanism, so that by using the two types of pixels A and B, a color image of RGB colors can be obtained.

In addition, when two PN junction parts are provided at the photoelectric conversion portion of the pixel B in a depth direction of the substrate, blue signals may be detected from the two PN junction parts.

In the solid-state image device according to the embodiment of the present invention, the two PN junction parts are provided in the photoelectric conversion portion of the pixel A so that the first color signal and the second color signal are detected using the difference in absorption of the individual colors, and the third color signal from the PN junction part provided in the photoelectric conversion portion of the pixel B is detected by the color filter separation method. Hence, the utilization rate of light can be improved as compared to that of a method for detecting all three colors by the color filter separation method, and superior color reproducibility can be realized as compared to a method for detecting all three colors using the three-well structure; hence, as a result, a solid-state image device capable of displaying superior image can be effectively provided.

EXAMPLE 1

Figure 1:
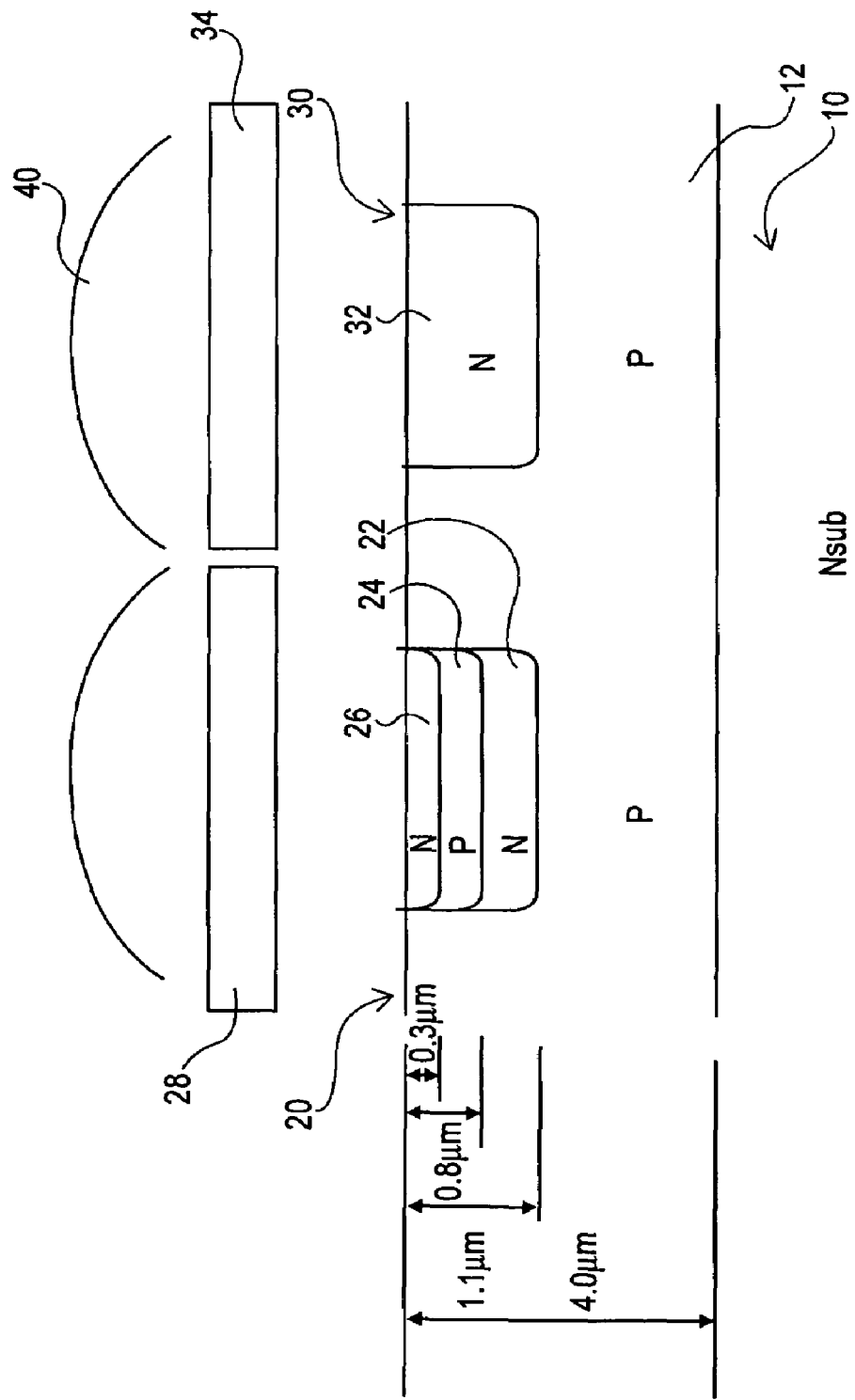
FIG. 1 is a cross-sectional view showing a first structure of a solid-state image device according to an example of the present invention.

FIG. 1 is a cross-sectional view showing a first structure of a solid-state image device of an example of the present invention.

FIG. 1 shows the state in which two types of pixel A 20 and pixel B 30 are formed in a P well region 12 which is provided in an upper layer portion of a silicon substrate 10. The pixels A and the pixels B were separated from each other by channel stop regions not shown in the figure, and as the entire element, a two-dimensional area sensor was formed in which the pixels were arranged to form a two-dimensional array.

A photoelectric conversion portion of the pixel A was formed of an N layer 22, a P layer 24, and an N layer 26 in that order from the bottom in the P well region 12, and had two PN junction parts including the P well region 12.

In addition, a photoelectric conversion portion of the other pixel B was formed of an N layer provided in the P well region 12 and had one PN junction part with the P well region 12.

As shown in the figure, the P well layer region has a thickness of 4.0 µm, and the depths of the N layer 22, the P layer 24, and the N layer 26 of the photoelectric conversion portion of the pixel A were 1.1 µm, 0.8 µm, and 0.3 µm, respectively. These were formed in consideration of the photosensitivity to the wavelengths of blue light and red light. In addition, in the photoelectric conversion portion of the pixel B, the depth of the N layer 32 was 1.1 µm.

In addition, a magenta filter 28 was disposed above the pixel A 20, and a green filter 34 was disposed above the pixel B 30. Hence, light from which a green light component was removed by the magenta filter 28 was incident on the photoelectric conversion portion of the pixel A 20, and the green light component was incident on the photoelectric conversion portion of the pixel B 30 by the green filter 34. In addition, above the color filters 28 and 34, micro lenses 40 were disposed so as to concentrate incident light on each pixel.

In addition, although not shown in the figure, transfer gates were provided for respective PN junction parts in the individual pixels, so that signal charges generated at the individual PN junction parts were each independently extracted therefrom at its own predetermined timing.

In the structure described above, in the pixel A 20, after the light from which the green light component was removed by the magenta filter 28 was incident on the photoelectric conversion portion, a signal charge of blue light was generated from the PN junction part between the P layer 24 and the N layer 26, located at the front surface side of the substrate, and a signal charge of red light was generated from the PN junction part between the P well region 12 and the N layer 22, located at the rear surface side of the substrate. Subsequently, after these signal charges were independently read and converted into a blue signal and a red signal, these signals thus obtained were output.

In the pixel B 30, l the green light component was incident on the photoelectric conversion portion by the green filter 34. Subsequently, after a signal charge of green light was generated from the PN junction between the P well 12 and the N layer 32 and was converted into a green signal, the signal thus obtained was output.

Figure 2:
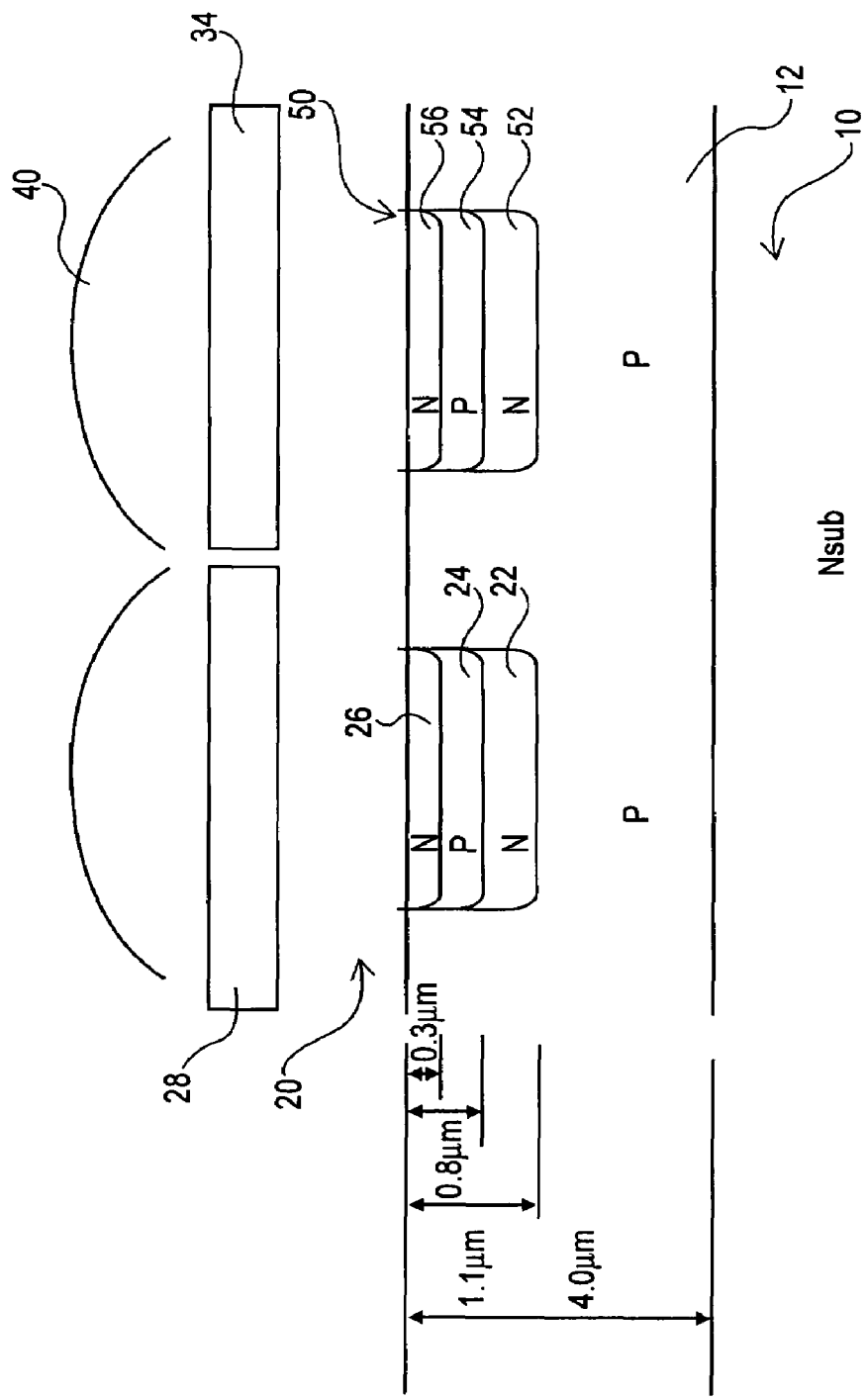
FIG. 2 is a cross-sectional view showing a second structure of a solid-state image device according to an example of the present invention.

FIG. 2 is a cross-sectional view showing a second structure of a solid-state image device of an example of the present invention. In FIG. 2, the same reference numerals of the elements in FIG. 1 designate the elements equivalent thereto.

In this example, as was the pixel A 20, in a photoelectric conversion portion of a pixel B 50, a three-layer structure composed of an N layer 52, a P layer 54, and an N layer 56 was formed in that order from the bottom, so that two PN junctions were formed together with the P well region 12. In addition, the depths of the individual layers were equivalent to those in the pixel A 20. In this pixel B 50, signal charges of green light were generated using the two PN junction parts and are combined into one green signal, and this one green signal is then output. Alternatively, the two green signals may be used separately as the color signal and the brightness signal.

In this example, it is not necessary to separately form the structure of the pixel A and that of the pixel B, and hence the formation can be easily performed.

FIGS. 3 to 6 are plan views each showing a specific pixel arrangement which may be used in this example.

Figure 3:
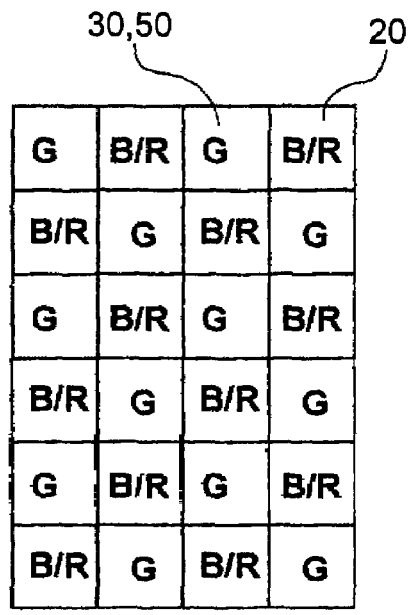
FIG. 3 is a plan view showing a first specific pixel arrangement used in an example of the present invention.

FIG. 3 shows one matrix in which the pixels A 20 (B/G) are continuously arranged in a diagonal line direction, the pixels B 30 or 50 (G) are also continuously arranged in a diagonal line direction, and the pixels A 20 (B/G) and the pixels B 30 or 50 (G) are disposed alternately in the longitudinal and the lateral directions. In a related mosaic arrangement, the number of R and the number of B are each one half of the number of G; however, in the example shown in FIG. 3, the number of R and that of B can be increased twice, and as a result, the color resolution can be advantageously improved.

Figure 4:
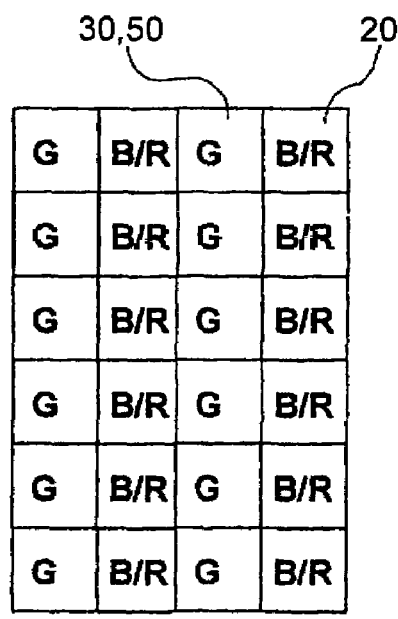
FIG. 4 is a plan view showing a second specific pixel arrangement used in an example of the present invention.

FIG. 4 shows one matrix in which lines of the pixels A 20 (B/R) and lines of the pixels B 30 or 50 (G) in a longitudinal direction are alternately disposed. In a related three-line pattern of RGB colors, three types of pixels are repeatedly disposed; however, in the example shown in FIG. 4, two types of pixels are repeatedly disposed, and as result, the color resolution can be advantageously improved.

FIG. 5 shows one matrix in which one line of the pixels A 20 (B/R) in a longitudinal direction and two lines of the pixels B 30 or 50 (G) in a longitudinal direction are alternately disposed. In a related three-line pattern of RGB colors, a green signal is used as a brightness signal; however, in the example shown in FIG. 5, since two green pixels are present in three pixels, even if one green signal is used as the brightness signal, when the signal of the other green pixel is synthesized with signals of the adjacent B/R pixel, the sensitivity can be increased twice without degrading the resolution.

FIG. 6 shows one matrix in which the pixels B 30 or 50 (G) are continuously disposed every other line in a longitudinal direction, and in addition, in the lines therebetween, the pixels A 20 (B/R) and the pixels B 30 or 50 are alternately disposed. In the arrangement described above, since the sampling number of R pixels and that of B pixels, which are necessary for forming color, are the same as that in the past, the color resolution is not degraded, and in addition, since the number of green pixels is increased twice as compared to that in the past, the resolution can be advantageously increased twice. In addition, when the addition of green signals is performed while the resolution is maintained as same as before, the sensitivity is increased in accordance with the addition described above.

Figure 7:
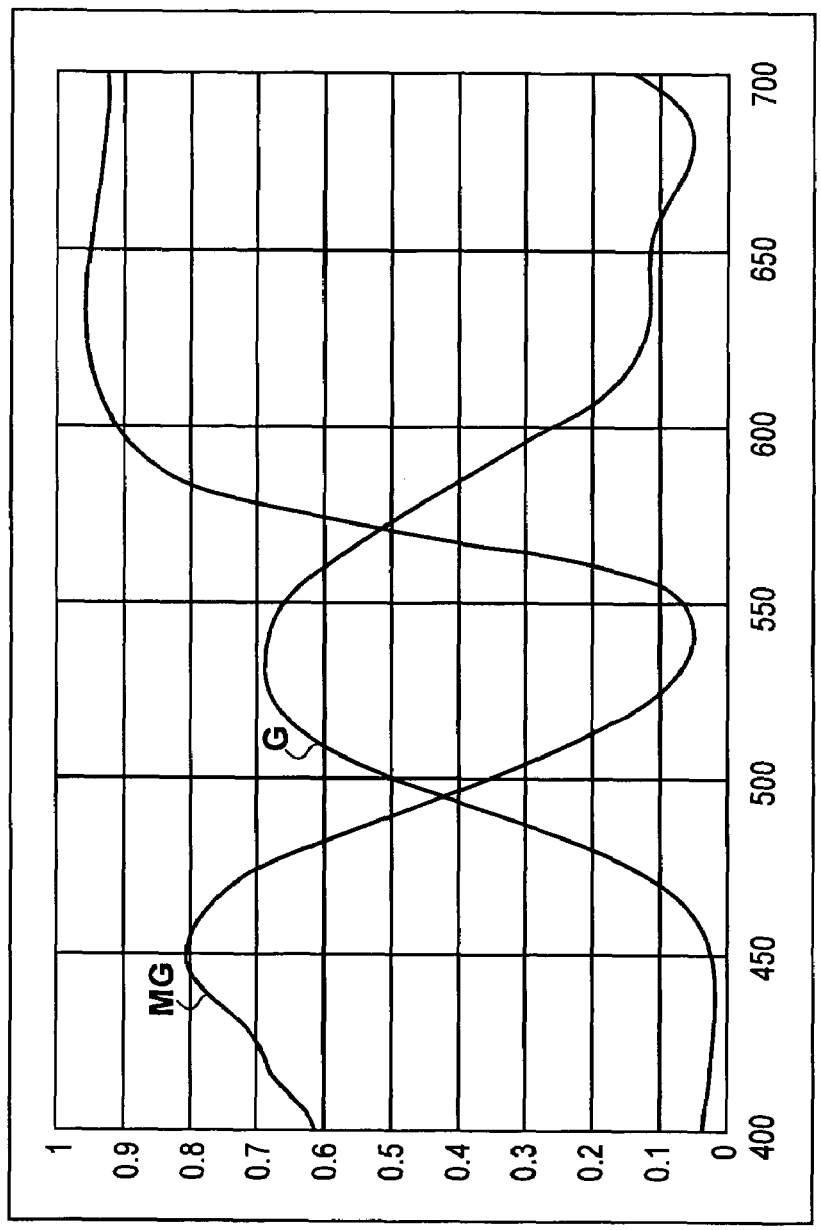
FIG. 7 is a graph illustrating spectral characteristics of a magenta filter and a green filter used in an example of the present invention.

FIG. 7 is a graph showing the spectral characteristics of a magenta filter and a green filter. As shown in the figure, the magenta filter represented by MG allows light from which a green light component is removed to pass, and on the other hand, the green filter represented by G allows the green light component to pass.

Figure 8:
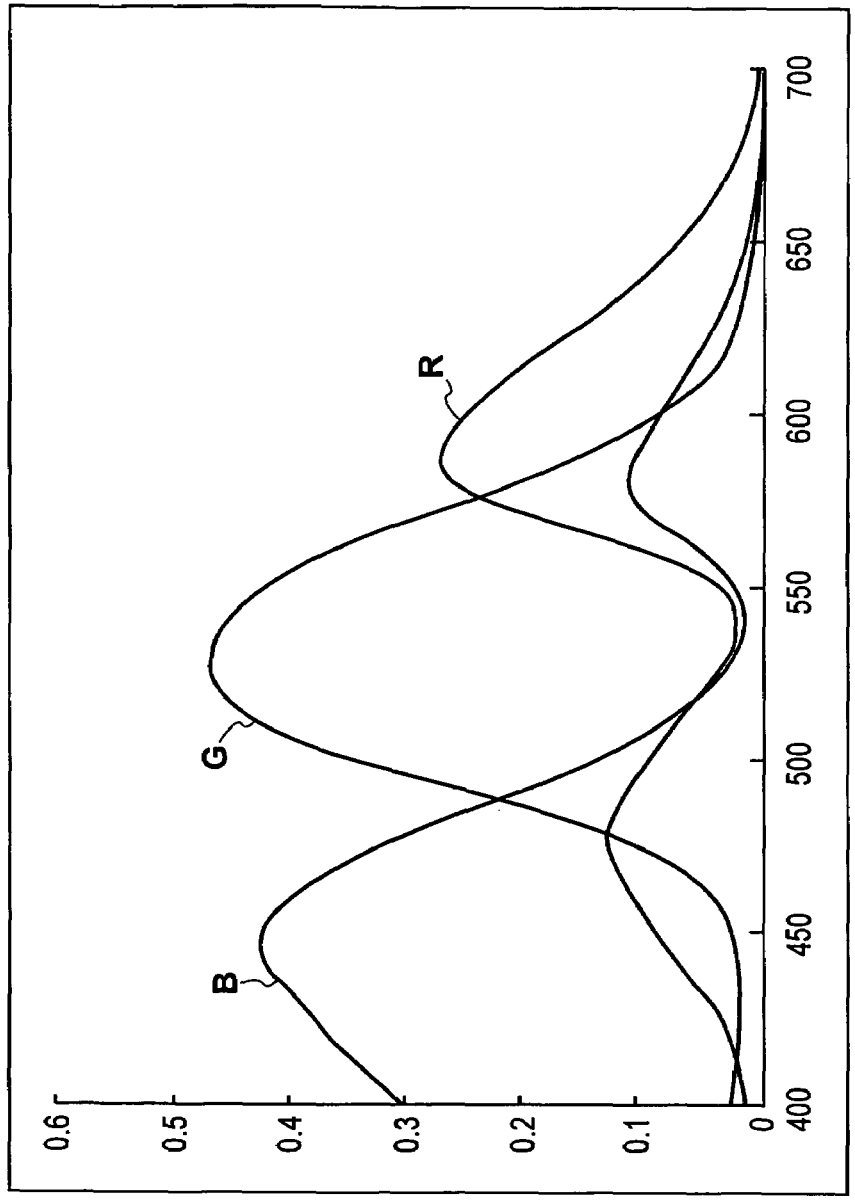
FIG. 8 is a graph illustrating output characteristics of RGB signals in the pixel arrangement shown in FIG. 1.
Figure 9:
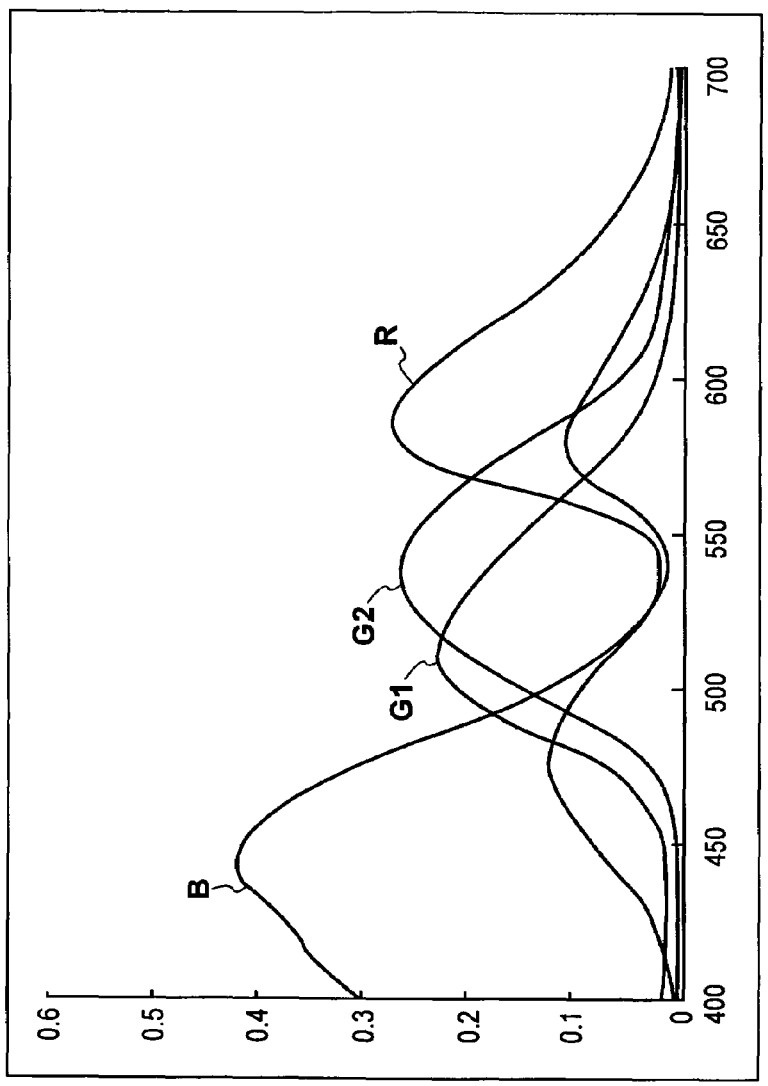
FIG. 9 is a graph illustrating output characteristics of RGB signals in the pixel arrangement shown in FIG. 2.

FIG. 8 is a graph showing output characteristics of RGB signals of the pixel arrangement shown in FIG. 1, and FIG. 9 is a graph showing output characteristics of RGB signals of the pixel arrangement shown in FIG. 2.

That is, as shown in FIG. 2, by forming a bulk structure having different underlayers, under one green filter, two different green signals G1 and G2 can be obtained.

In addition, in Example 1, the case was described in which a magenta filer is disposed above the pixel A, a green filter is disposed above the pixel B, a blue signal and a red signal are detected from the pixel A, and a green signal is detected from the pixel B. However, as another example, the structure may be formed in which a cyan filter is disposed above the pixel A, a red filter is disposed above the pixel B, and a blue signal and a green signal are detected from the pixel A, and a red signal is detected from the pixel B.

In addition, as still another example, the structure may also be formed in which a yellow filter is disposed above the pixel A, a blue filter is disposed above the pixel B, and a green signal and a red signal are detected from the pixel A, and a blue signal is detected from the pixel B. However, since color separation is performed in the pixel A for detecting two colors by exploiting the difference in position in the depth direction at which photoelectric conversion occurs, in the case as is Example 1 in which a magenta filter is disposed above the pixel A and a blue signal and a red signal are detected therefrom, the difference in position in the depth direction is large, and thereby the color mixture is unlikely to occur, so that a superior image can be obtained.

In FIG. 10, a structural example is shown in which two types of charges stored in the pixel A are read. Although not shown in FIGS. 1 and 2, the structure is shown in FIG. 10 in which the N layer 26 of the pixel A located at the front surface side of the substrate and the N layer 22 located at the rear surface side of the substrate have portions which independently extend to the surface of the substrate. In addition, in FIG. 10, a P layer 80 is provided in a surface portion of the substrate, and this P layer 80 is a so-called hole accumulation layer (HAD layer). Through a reading electrode 61 provided above the substrate, the charge stored in the N layer 26 located at the front surface side of the substrate is read by a accumulation portion for charge detection 71. In addition, through a reading electrode 62 provided above the substrate, the charge stored in the N layer 22 located at the rear surface side of the substrate is read by a accumulation portion for charge detection 72. Subsequently, the charges stored in the accumulation portions for charge detection 71 and 72 are converted into pixel signals by detection transistors or the like and are then output. In addition, in the case in which signals having the same color are detected at different positions in the depth direction of the pixel B, signal output can be performed using the structure similar to that described above.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image device comprising: a semiconductor substrate; pixels A each containing a photoelectric conversion portion in which at least two PN junction parts are provided in a depth direction of the semiconductor substrate; pixels B each containing a photoelectric conversion portion in which at least one PN junction part is provided;

first color filters provided above the pixels A; second color filters provided above the pixels B; and detection means for detecting a first color signal and a second color signal from the two PN junction parts of each of the pixels A and wherein the PN junction part of each of the pixels B provides a third color signal, wherein the pixels B generate two or more signals each being different from color signals generated by the pixels A for generating a single image wherein a matrix in which one line of the pixels A 20 (B/R) in a longitudinal direction and two lines of the pixels B 30 or 50 (G) in a longitudinal direction are alternately disposed or a matrix in which the pixels B 30 or 50 (G) are continuously disposed every other line in a longitudinal direction, and in addition, in the lines therebetween, the pixels A 20 (B/R) and the pixels B 30 or 50 are alternately disposed.

2. The solid-state image device according to claim 1, wherein the first color filters are filters for removing the third color signal.

3. The solid-state image device according to claim 1, wherein the photoelectric conversion portion of each of the pixels B has two PN junction parts in the depth direction of the semiconductor substrate, and the detection means detects the third color signal from the two PN junction parts of each of the pixels B.

4. The solid-state image device according to claim 3, wherein the photoelectric conversion portion of each of the pixels A and the photoelectric conversion portion of each of the pixels B have layered structures equivalent to each other.

5. The solid-state image device according to claim 1, wherein the first color filters are magenta filters, the second color filters are blue filters, the first color signal is a blue signal, the second color signal is a red signal, and the third signal is a green signal.

6. A solid-state image device comprising: a semiconductor substrate; pixels A each containing a photoelectric conversion portion in which at least two PN junction parts are provided in a depth direction of the semiconductor substrate; pixels B each containing a photoelectric conversion portion in which at least one PN junction part is provided; first color filters provided above the pixels A; second color filters provided above the pixels B; and a detection mechanism for detecting a first color signal and a second color signal from the two PN junction parts of each of the pixels A and wherein the PN junction part of each of the pixels B provides a third color signal, wherein the pixels B generate two or more signals each being different from color signals generated by the pixels A for generating a single image; and wherein a matrix in which one line of the pixels A 20 (B/R) in a longitudinal direction and two lines of the pixels B 30 or 50 (G) in a longitudinal direction are alternately disposed or a matrix in which the pixels B 30 or 50 (G) are continuously disposed every other line in a longitudinal direction, and in addition, in the lines therebetween, the pixels A 20 (B/R) and the pixels B 30 or 50 are alternately disposed.

* * * * *